(12) United States Patent
Waki (10) Patent No.: US 11,642,730 B2
(45) Date of Patent: May 9, 2023

(54) CUTTING TOOL

(71) Applicant: KYOCERA CORPORATION, Kyoto (JP)

(72) Inventor: Masahiro Waki, Satsumasendai (JP)

(73) Assignee: KYOCERA Corporation, Kyoto (JP)

( * ) Notice: Subject to any disclaimer, the term of this patent is extended or adjusted under 35 U.S.C. 154(b) by 89 days.

(21) Appl. No.: 16/096,310

(22) PCT Filed: Apr. 21, 2017

(86) PCT No.: PCT/JP2017/016057
§ 371 (c)(1),
(2) Date: Oct. 25, 2018

(87) PCT Pub. No.: WO2017/188154
PCT Pub. Date: Nov. 2, 2017

(65) Prior Publication Data
US 2019/0134721 A1 May 9, 2019

(30) Foreign Application Priority Data

Apr. 25, 2016 (JP) .............................. JP2016-087151

(51) Int. Cl.
*B23C 5/16* (2006.01)
*B23B 27/14* (2006.01)
*B23D 77/00* (2006.01)

(52) U.S. Cl.
CPC ................ *B23C 5/16* (2013.01); *B23B 27/14* (2013.01); *B23D 77/00* (2013.01); *B23C 2226/31* (2013.01); *B23C 2228/10* (2013.01)

(58) Field of Classification Search
CPC .......... B23C 2226/31; B23C 2226/315; B23C 2228/10; B23C 2200/368;
(Continued)

(56) References Cited

U.S. PATENT DOCUMENTS 2,164,303 A * 7/1939 Berg ...................... B23B 27/005
29/90.01
3,636,602 A * 1/1972 Owen ...................... B23C 5/202
407/113
(Continued)

FOREIGN PATENT DOCUMENTS

JP H06-312319 A 11/1994
JP 2002-187793 A 7/2002
(Continued)

OTHER PUBLICATIONS

Description JP4511226 (translation) obtained at https://worldwide.espacenet.com/ (last visited Apr. 15, 2020).*

*Primary Examiner* — Ryan Rufo
(74) *Attorney, Agent, or Firm* — Viering, Jentschura & Partner mbB (57) ABSTRACT

A cutting tool may include a base member and a diamond layer located on the base member. The cutting tool may include a first surface, a second surface, and a cutting edge located in at least a part of a ridge line which the first surface intersects with the second surface. The diamond layer may be located in at least a part of the first surface, at least a part of the second surface, and at least a part of the cutting edge. A maximum height in the cutting edge may be smaller than a maximum height in the first surface. The maximum height in the cutting edge may be greater than a maximum height in the second surface.

11 Claims, 11 Drawing Sheets

(58) Field of Classification Search
CPC ........ B23C 2210/241; B23C 2200/205; B23B 2226/31; B23B 2226/315; B23B 2228/10; B23B 2228/105; B23B 2251/241; B23B 27/20; B23B 2200/204; B23D 2277/2442; B23D 2277/245
See application file for complete search history.

(56) References Cited

U.S. PATENT DOCUMENTS

| | | | | |
|---|---|---|---|---|
| 3,791,001 | A * | 2/1974 | Bennett | B23C 5/202 407/116 |
| 3,875,631 | A * | 4/1975 | Malinchak | B23C 5/202 407/113 |
| 4,068,976 | A * | 1/1978 | Friedline | B23C 5/2269 407/114 |
| 4,140,431 | A * | 2/1979 | Friedline | B23C 5/2269 407/61 |
| 5,085,542 | A * | 2/1992 | Nakayama | B23B 27/141 407/114 |
| 5,178,645 | A * | 1/1993 | Nakamura | B23B 27/145 51/293 |
| 5,221,164 | A * | 6/1993 | Allaire | B23C 5/202 407/113 |
| 5,585,176 | A * | 12/1996 | Grab | C23C 16/27 428/336 |
| 5,709,907 | A * | 1/1998 | Battaglia | B23B 27/146 427/126.1 |
| 6,161,990 | A * | 12/2000 | Oles | B23B 27/145 407/113 |
| 6,524,036 | B1 * | 2/2003 | Kolker | C21D 9/22 409/131 |
| 8,025,465 | B2 * | 9/2011 | Ishida | B23C 5/202 407/115 |
| 8,419,320 | B2 * | 4/2013 | Sung | B23C 5/06 407/66 |
| 8,475,092 | B2 * | 7/2013 | Ishida | B23C 5/202 407/42 |
| 9,144,845 | B1 * | 9/2015 | Grzina | B23B 27/00 |
| 10,124,425 | B2 * | 11/2018 | Nagami | B23C 5/06 |
| 10,155,270 | B2 * | 12/2018 | Aso | B23C 5/202 |
| 10,160,083 | B2 * | 12/2018 | Watanobe | B24B 3/34 |
| 10,259,053 | B2 * | 4/2019 | Saji | B23C 5/06 |
| 2002/0001717 | A1 * | 1/2002 | Hanyu | C23C 16/279 428/408 |
| 2002/0040848 | A1 | 4/2002 | Sakurai et al. | |
| 2003/0230182 | A1 * | 12/2003 | Oles | B23B 27/14 83/743 |
| 2004/0253379 | A1 * | 12/2004 | Sugita | C23C 14/58 427/355 |
| 2006/0115650 | A1 * | 6/2006 | Hanyu | C04B 41/89 428/408 |
| 2007/0253787 | A1 * | 11/2007 | Ishii | B23B 27/141 407/113 |
| 2007/0280792 | A1 * | 12/2007 | Kochan | B23C 5/10 407/53 |
| 2008/0219782 | A1 * | 9/2008 | Flynn | B23C 5/10 407/42 |
| 2009/0003944 | A1 * | 1/2009 | Omori | C23C 28/042 407/119 |
| 2011/0081210 | A1 * | 4/2011 | Ishida | B23C 5/202 407/42 |
| 2014/0338512 | A1 * | 11/2014 | Suzuki | B23B 27/14 83/651 |
| 2015/0117972 | A1 * | 4/2015 | Osaki | B23C 5/1009 407/115 |
| 2015/0321262 | A1 * | 11/2015 | Kondameedi | B23B 27/145 407/115 |
| 2016/0040283 | A1 * | 2/2016 | Ogami | C23C 14/54 428/336 |
| 2016/0243625 | A1 * | 8/2016 | Waki | C23C 16/26 |

FOREIGN PATENT DOCUMENTS

| | | |
|---|---|---|
| JP | 2002-370107 A | 12/2002 |
| JP | 3477182 B2 | 12/2003 |
| JP | 2005279822 A * | 10/2005 |
| JP | 2005-313287 A | 11/2005 |
| JP | 4511226 B2 * | 7/2010 |
| JP | 2011-020248 A | 2/2011 |
| JP | 2011-101910 A | 5/2011 |
| JP | 2012176471 A * | 9/2012 |
| WO | 0029169 A1 | 5/2000 |

* cited by examiner

CUTTING TOOL

CROSS-REFERENCE TO RELATED APPLICATIONS

This application is a national stage entry according to 35 U.S.C. 371 of PCT Application No. PCT/JP2017/016057 filed on Apr. 21, 2017, which claims priority to Japanese Application No. 2016-087151 filed on Apr. 25, 2016, which are entirely incorporated herein by reference.

TECHNICAL FIELD

The present disclosure relates to a cutting tool including a diamond layer on a base member.

BACKGROUND

A cutting tool including a diamond layer may be deposited on a surface of a base member. For example, Japanese Unexamined Patent Publication No. 2002-187793 (Patent Document 1) discusses a method of smoothening a surface of a diamond layer by so-called metal bombardment treatment causing plus ions generated in a target to collide with the surface of the diamond layer.

SUMMARY

In a non-limiting aspect of the disclosure, a cutting tool includes a base member and a diamond layer located on the base member. The cutting tool includes a first surface, a second surface, and a cutting edge located in at least a part of a ridge line which the first surface intersects with the second surface. The diamond layer is located in at least a part of the first surface, at least a part of the second surface, and at least a part of the cutting edge. A maximum height in the cutting edge is smaller than a maximum height in the first surface. The maximum height in the cutting edge is greater than a maximum height in the second surface.

DETAILED DESCRIPTION

Recently, reducing chatter vibration in an early stage of a cutting process, good chip discharge performance, and further smoothness of a finish surface are demanded for cutting tools.

Figure 1:
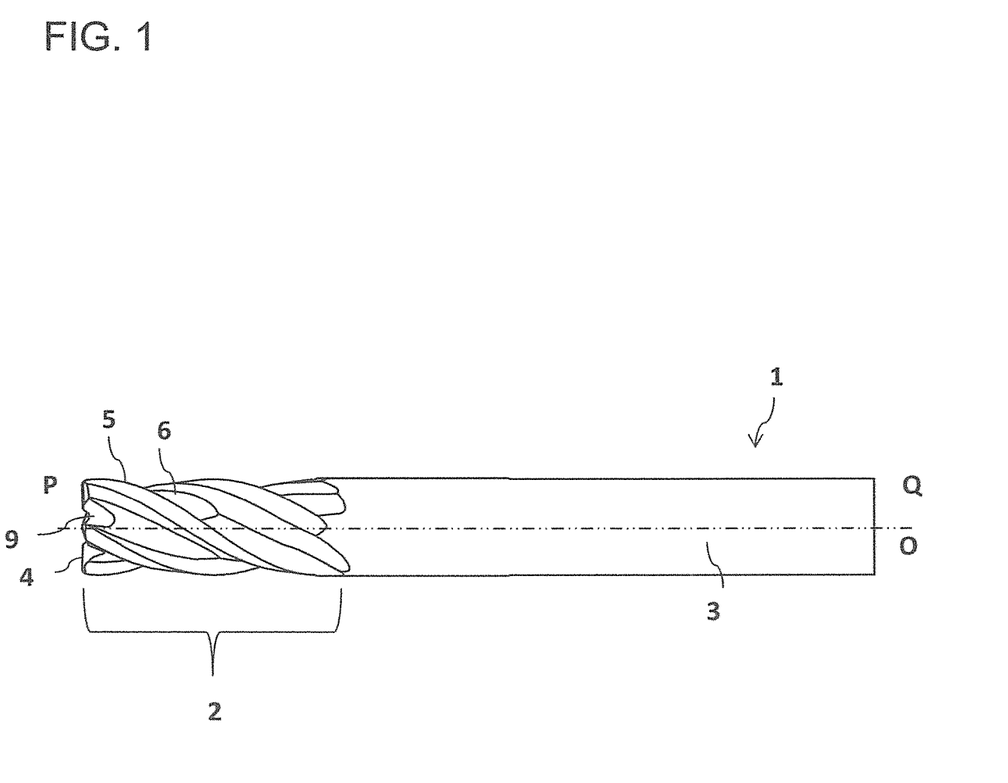
FIG. 1 is a side view illustrating a cutting tool in a non-limiting aspect of the disclosure.

FIG. 1 is a side view of a cutting tool 1 in a non-limiting aspect of the disclosure. The present non-limiting aspect of the disclosure illustrates a solid-type end mill as a cutting tool. Examples of such cutting tools may include drills and reamers besides end mills.

Figure 2:
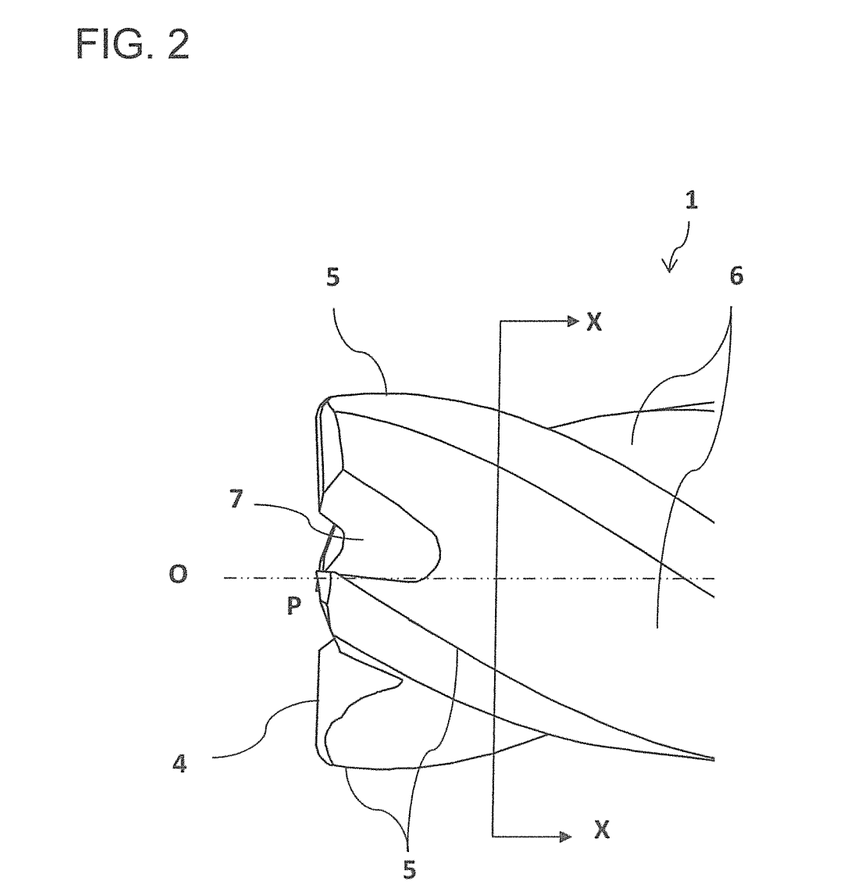
FIG. 2 is an enlarged view of a side of a first end P in the cutting tool of FIG. 1.

The cutting tool 1 illustrated in FIG. 1 has a rotation axis O and a bar shape extending from a first end P to a second end Q. The cutting tool 1 includes a cutting edge part 2 located at a side of the first end P, and a shank part 3 located at a side of the second end Q. As illustrated in FIGS. 1 and 2, the cutting edge part 2 includes a second cutting edge 4 (end cutting edge) located at a side of the first end P, a first cutting edge 5 (peripheral cutting edge) extending from an outer peripheral end in the second cutting edge 4 toward the second end Q, a first groove 6, at least part of which is located along the first cutting edge 5, and a gash 7 located between the second cutting edge 4 and the first groove 6. FIG. 2 is a partially enlarged view of a side of the first end P in the cutting tool 1 (a left side in FIG. 1). The first end P is located at an end portion on a side of the cutting edge part 2 in the cutting tool 1, and the second end Q is located at an end portion on a side of the shank part 3 in the cutting tool 1 in the present non-limiting aspect of the disclosure.

Figure 3:
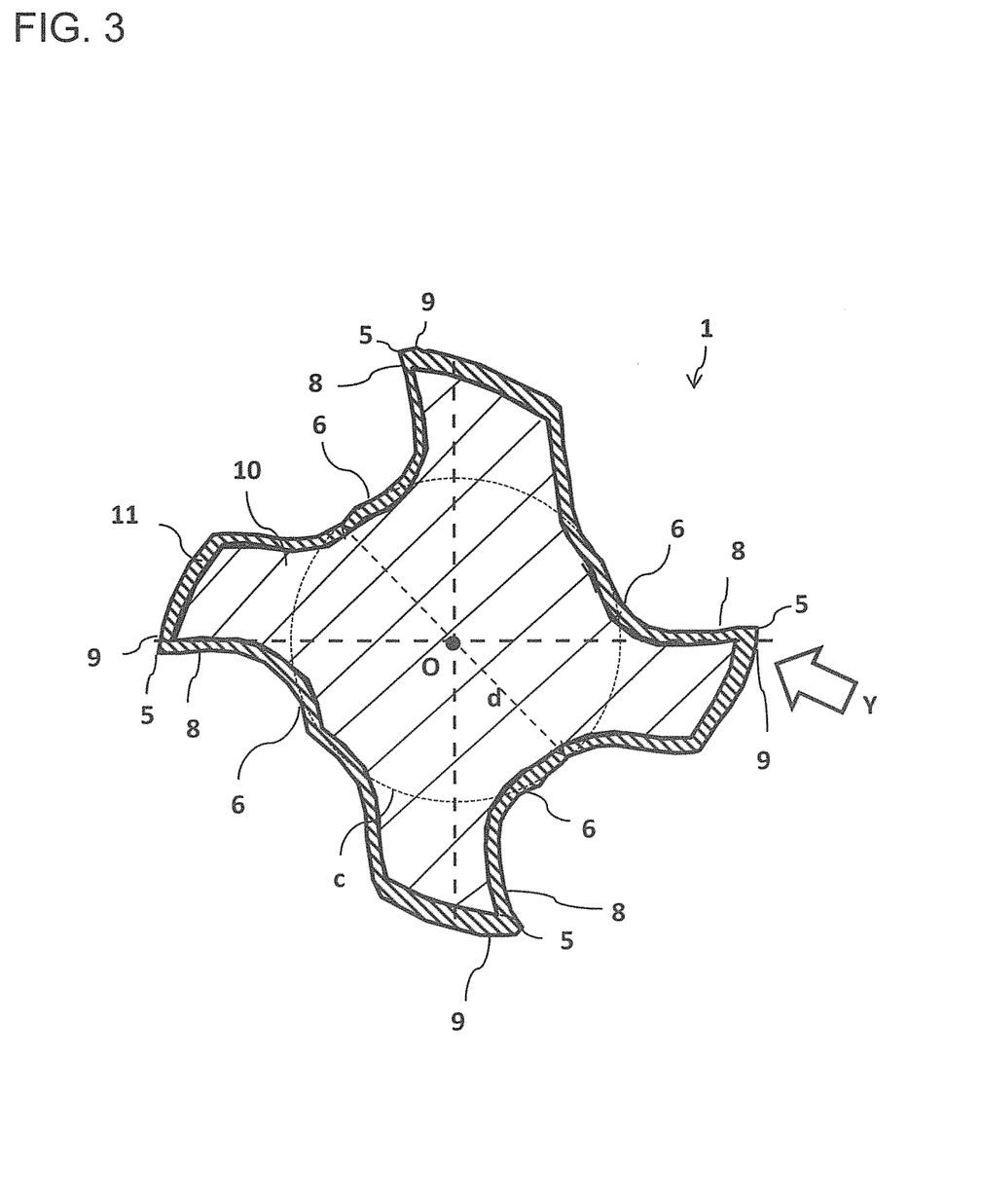
FIG. 3 is a sectional view taken along line X-X in FIG. 2.

As illustrated in FIG. 1, the cutting tool 1 in the present non-limiting aspect of the disclosure includes the first groove 6, an outer peripheral surface, and a ridge line along which the first groove 6 intersects with the outer peripheral surface. Specifically, the first groove 6 includes a first surface 8 (outer peripheral rake surface) located along the ridge line, and the outer peripheral surface includes a second surface 9 (outer peripheral flank surface) located along the ridge line. In other words, the first cutting edge 5 is located in at least a part of the ridge line which the first surface 8 intersects with the second surface 9 as illustrated in FIG. 3. It can also be regarded that the first surface 8 includes a rake surface region and the second surface 9 includes a flank surface region. The first groove 6 is usable as space that permits passage of chips generated by the first cutting edge 5.

The cutting tool 1 also includes a base member 10 and a diamond layer 11 located on the base member 10 as illustrated in FIG. 3. Although FIG. 3 illustrates a non-limiting aspect of the disclosure where the diamond layer 11 is in contact with the base member 10, another layer other than the diamond layer 11 may be located between the base member 10 and the diamond layer 11.

The diamond layer 11 is located in at least a part of the first surface 8, at least a part of the second surface 9, and at least a part of the first cutting edge 5 in the present non-limiting aspect of the disclosure. Durability of each of the first surface 8, the second surface 9, and the first cutting edge 5 can be enhanced because the diamond layer 11 is located in the above-mentioned regions. Particularly, when the diamond layer 11 is located over the entirety of the first surface 8, the second surface 9, and the first cutting edge 5, the durability of the first surface 8, the second surface 9, and the first cutting edge 5 can be further enhanced.

A maximum height Ry (hereinafter referred to as "Rye" for identification) in a part of the first cutting edge 5, at which the diamond layer 11 is located, is smaller than a maximum height Ry (hereinafter referred to as "Ryr" for identification) in a part of the first surface 8, at which the diamond layer 11 is located, in the cutting tool 1 of the present non-limiting aspect of the disclosure.

The maximum height Rye in the part of the first cutting edge 5, at which the diamond layer 11 is located, is greater than a maximum height Ry (hereinafter referred to as "Ryf"

for identification) in a part of the second surface 9, at which the diamond layer 11 is located. That is, a relationship of Ryf<Rye<Ryr is established.

Because of Ryf<Rye, a surface of the diamond layer 11 in the second surface 9 is smoother than a surface of the diamond layer 11 in the first cutting edge 5. This leads to improved finish surface roughness of a workpiece. Because of Rye<Ryr, a surface of the diamond layer 11 in the first surface 8 is rougher than the surface of the diamond layer 11 in the first cutting edge 5. Therefore, when chips come into contact with the first surface 8, the chips tend to deform or alter on the first surface 8. Consequently, the chips are less likely to extend excessively, thus leading to enhanced chip discharge performance.

Additionally, the first cutting edge 5 is less likely to excessively come into contact with the workpiece because the first cutting edge 5 is smoother than the first surface 8. The first cutting edge 5 is less likely to come into a flat contact with the workpiece and cutting resistance is reducible at the start of a cutting process because the first cutting edge 5 is rougher than the second surface 9. Consequently, chatter vibration is less likely to occur in the first cutting edge 5.

Figure 4:
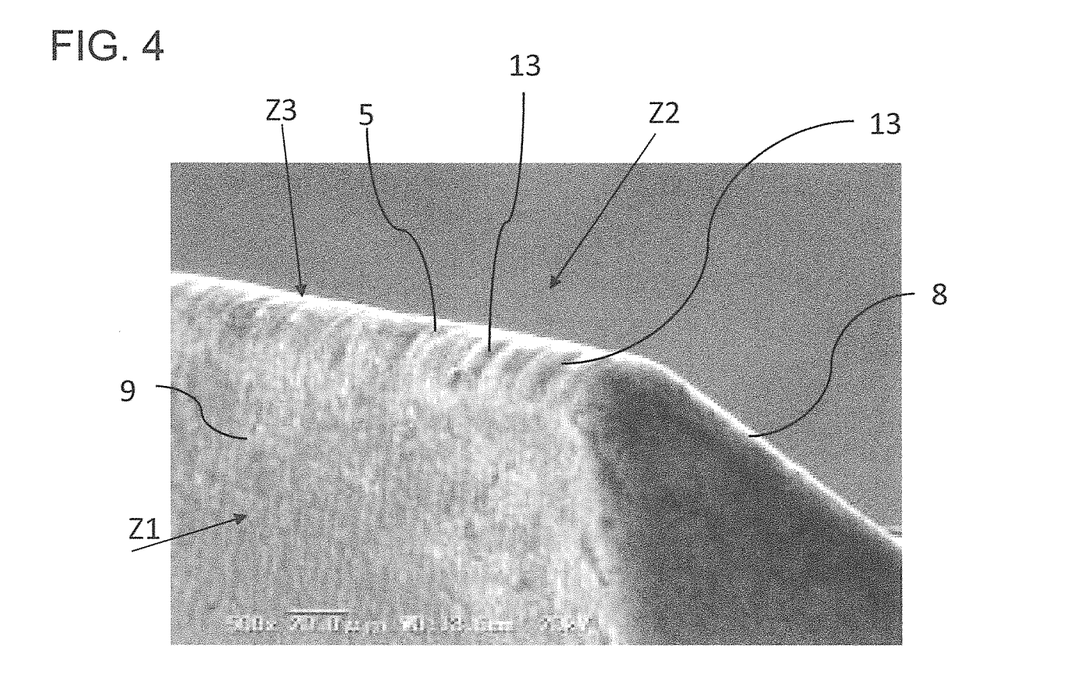
FIG. 4 is an SEM photograph when the cutting tool of FIG. 3 is viewed from the direction indicated as "Y"
Figure 5:
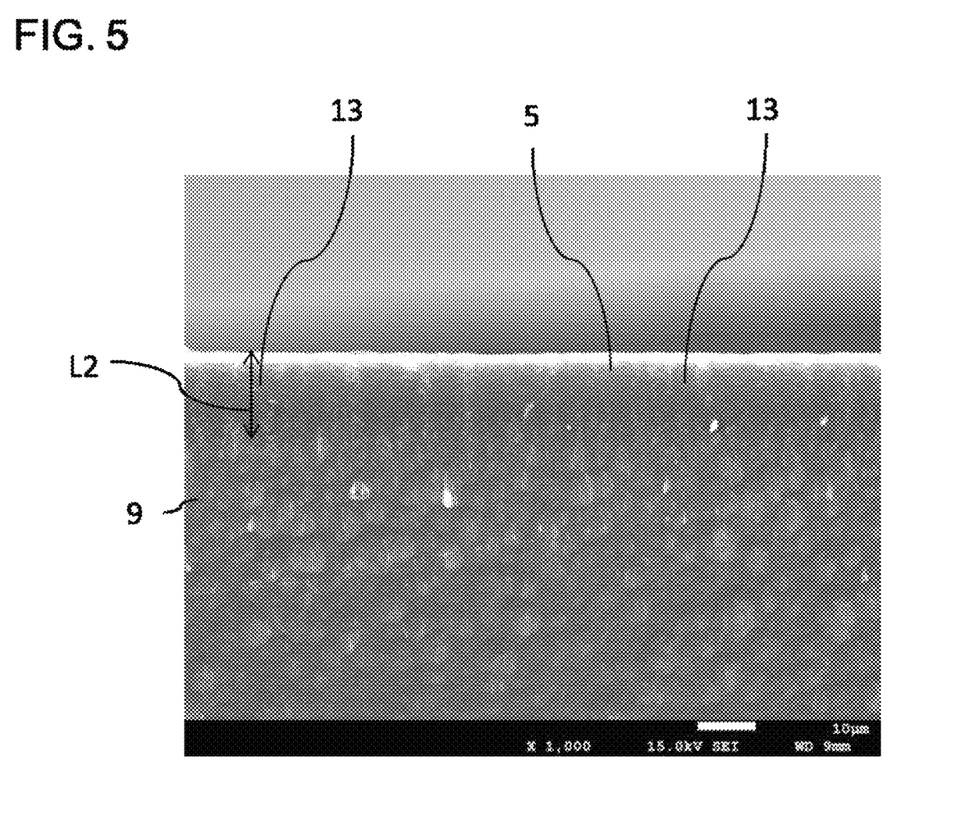
FIG. 5 is an SEM photograph when the cutting tool of FIG. 4 is viewed from the direction indicated as "Z1"
Figure 6:
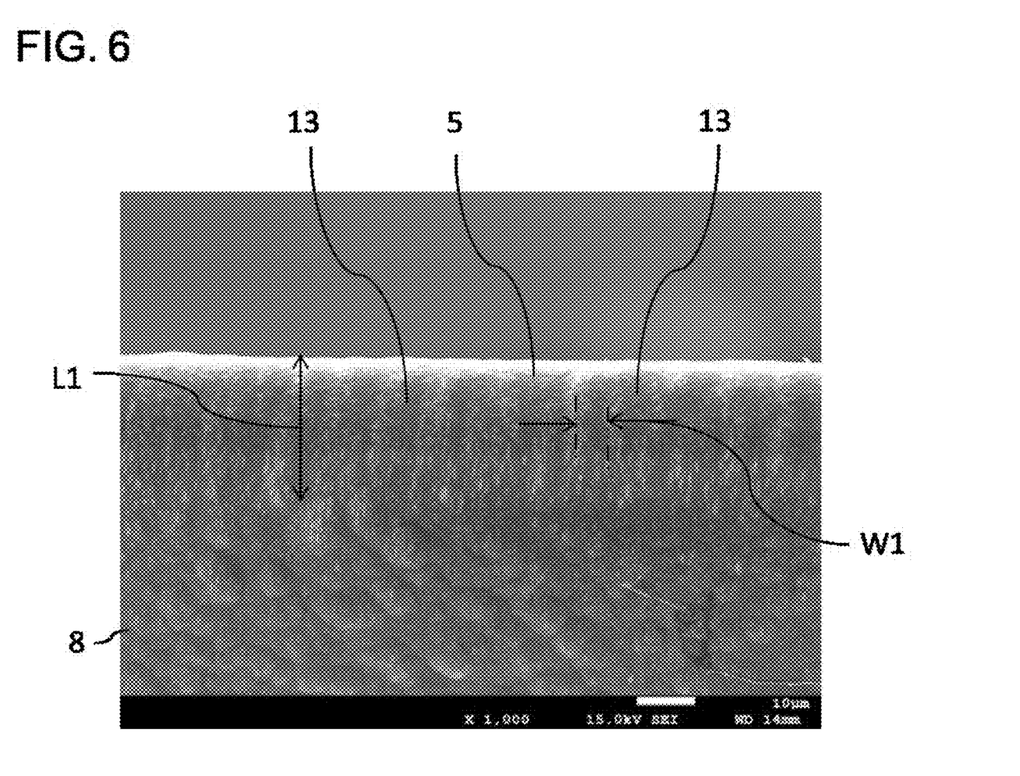
FIG. 6 is an SEM photograph when the cutting tool of FIG. 4 is viewed from the direction indicated as "Z2"
Figure 7:
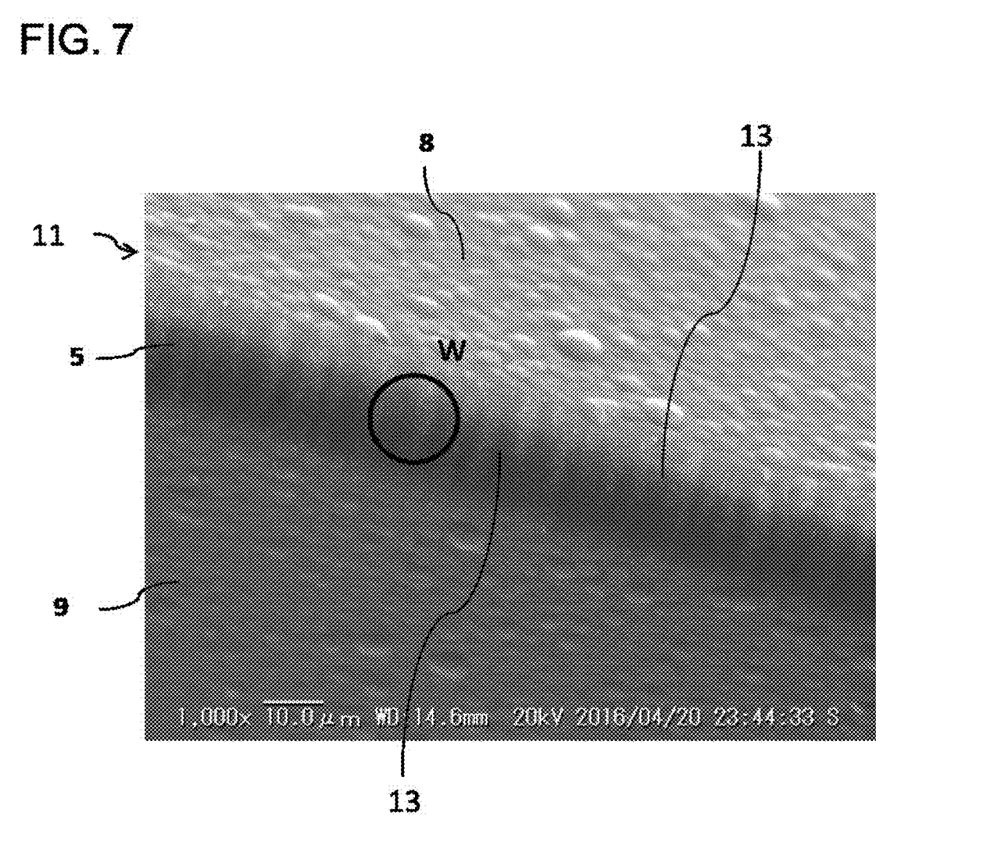
FIG. 7 is an SEM photograph when the cutting tool of FIG. 4 is viewed from the direction indicated as "Z3"

FIGS. 4 to 7 respectively illustrate, through Scanning Electron Microscope (SEM) photographs, a surface state of the diamond layer 11 under the conditions that the relationship of Ryf<Rye<Ryr is established in the cutting tool 1 of the present non-limiting aspect of the disclosure. FIG. 4 is the SEM photograph in the first cutting edge 5. FIGS. 5 to 7 are respectively the SEM photographs as viewed in arrowed directions of Z1 to Z3 in FIG. 4. The second surface 9 is smoother than the first surface 8 as illustrated, for example, in FIG. 7.

Hereinafter, an arithmetic mean roughness in the first cutting edge 5 is referred to as "Rae", an arithmetic mean roughness in the surface 8 is referred to as "Rar", and an arithmetic mean roughness in the second surface 9 is referred to as "Raf". Chatter vibration is less likely to occur at the start of the cutting process, and chip discharge performance is further enhanced and surface roughness of a finish surface becomes better and smoother when the cutting tool 1 satisfies the following conditions.

Specifically, the excellent cutting tool 1 as described above is obtainable when Rye is 0.3-0.7 µm, Rae is 0.06-0.1 µm, Ryr is 0.8-1.4 µm, Rar is 0.1-0.25 µm, Ryf is 0.1-0.5 µm, and Raf is 0.04-0.08 µm. The maximum heights Rye, Ryr, and Ryf, and the arithmetic mean roughnesses Rae, Rar, and Raf need to be calculated on the basis of, for example, methods for measuring a maximum height Ry and an arithmetic mean roughness Ra in accordance with JIS B0601'2001.

Hereinafter, an SP3 ratio is a ratio (SP3/SP2) obtainable from an SP3 peak derived from diamond crystals measurable by Raman spectrum analysis, and an SP2 peak derived from a graphite phase. When an SP3 ratio in the first cutting edge 5 is greater than an SP3 ratio in each of the first surface 8 and the second surface 9, a proportion of the diamond crystals is high in the first cutting edge 5. This enhances hardness of the diamond layer 11, thus leading to the cutting tool 1 having excellent wear resistance.

A proportion of the diamond crystals is low and a graphite phase having low hardness is high in each of the first surface 8 and the second surface 9. Therefore, a surface state can be fitted to a shape of a workpiece during the cutting process, thereby improving chip discharge performance and also smoothening finish surface roughness.

The SP3 ratio is also measurable in the surface of the diamond layer 11, or alternatively measurable in a cross section of the diamond layer 11. Either one of these measuring manners needs to be selected in order to compare an SP3 ratio in the first cutting edge 5 and the SP3 ratio in each of the first surface 8 and the second surface 9. When the SP3 ratio is measured in the cross section of the diamond layer 11, and as a result, an SP3 ratio at an interface position in a thickness range up to 1 µm from an interface between the base member 10 and the diamond layer 11 in a direction toward the diamond layer 11 is higher than an SP3 ratio at an intermediate position in thickness of the diamond layer 11, adhesion between the base member 10 and the diamond layer 11 can be enhanced, and fracture resistance of the diamond layer 11 can also be enhanced.

When a contour of each of the diamond crystals is observable, for example, in observations of the first cutting edge 5 at magnifications of 10000-30000, protrusions of the diamond crystals having strong self-form properties are smoothened. The diamond layer 11 is therefore less likely to excessively come into contact with a workpiece in the first cutting edge 5. The reason for this is as follows. When the contour of each of the diamond crystals is observable, the protrusions of the diamond crystals having the strong self-form properties, which protrude from the surface of the diamond layer 11, are smoothened, resulting in a state in which traces due to the self-form of the diamond crystals are invisible.

In the present non-limiting aspect of the disclosure, the term "self-form" denotes keeping a crystal structure inherent in diamond, and the term "self-form properties" is an index indicating a degree of similarity to the crystal structure inherent in diamond.

Examples of diamond crystal include diamond crystals with a micro-order size (micro crystals) and diamond crystals with a nano-order size (nano crystals). Particularly, the micro-ordered diamond crystals are capable of further enhancing the hardness of the diamond layer 11.

If a large amount of polishing waste remains after a polishing process is carried out to form the first cutting edge 5, the large amount of polishing waste may enter a grain boundary between the diamond crystals. It is therefore difficult to observe the grain boundary serving as a contour of the diamond crystals, in other words, no diamond crystal is observable. In contrast, little or no polishing waste remains because the contours of the diamond crystals are observable in the first cutting edge 5. In a state in which little or no polishing waste remains, a processing surface is less likely to be damaged by the polishing waste during a cutting process. This may be observable in an SEM photograph of a key part of the first cutting edge 5, which may be enlarged at magnification of 25000, in which the diamond crystal may be identified. When the grain boundary serving as the contour of the diamond crystals cannot be identified in the SEM photograph where the first cutting edge 5 is enlarged at magnifications of 25000, it is necessary to observe an SEM photograph where the first cutting edge 5 is enlarged at magnification of 30000.

In cases where the diamond crystals cannot be identified when the first surface 8 is observed at the same magnification as the observation magnification for the first cutting edge 5, chips are less likely to be wound because the chips tend to deform or alter on the first surface 8.

Although a mean particle diameter of the diamond crystals when the first cutting edge 5 is enlarged is not limited to a specific value, the mean particle diameter is settable to, for example, 0.5-3 µm. The diamond layer 11 is less likely to excessively come into contact with the workpiece on the first cutting edge 5 when the mean particle diameter of the diamond crystals falls within the above range.

The mean particle diameter of the diamond crystals can be evaluated as follows. Areas of the individual diamond crystals surrounded by the contour are found, and a mean value of these areas is converted into a circle. The mean particle diameter of the diamond crystals can be evaluated as a diameter of the circle. When measuring the areas, the measurement is carried out on the diamond crystals observable on the photograph, but the diamond crystals, a part of which extends beyond the photograph, are excluded from measuring objects.

The ridge line which the first cutting edge 5 is located has macroscopically a line shape, but there is no need to have a strict line shape. The ridge line which the first surface 8 intersects with the second surface 9 may have microscopically a curved surface shape. When the ridge line has the curved surface shape, the first cutting edge 5 is less susceptible to "fracture," thus leading to enhanced durability of the first cutting edge 5. The first cutting edge 5 microscopically having the curved surface shape needs to be manufactured by applying a chamfering process or honing process to the ridge line.

FIG. 4 illustrates a non-limiting aspect of the disclosure where the first cutting edge 5 has a curved surface shape. The first cutting edge 5 illustrated in FIG. 4 has a convex curved surface shape in a cross section orthogonal to the ridge line. The first cutting edge 5 illustrated in FIG. 4 also includes a plurality of second grooves 13 extending in a direction intersecting with the ridge line as illustrated in FIGS. 5 to 7.

As apparent from the fact that the first cutting edge 5 is easily observable as having the curved surface shape in FIG. 4, it is not necessarily needed to evaluate in a cross section as to whether the first cutting edge 5 has the convex curved surface shape. The shape of the first cutting edge 5 in a direction orthogonal to the ridge line may be evaluated by using, for example, the contact-type surface roughness measuring instrument using the probe or the non-contact type surface roughness measuring instrument using lasers.

When the first cutting edge 5 includes the second grooves 13, it is possible to reduce a contact area of the first cutting edge 5 with respect to a workpiece at the start of the cutting process. This leads to reduced cutting resistance, and chatter vibration is less likely to occur in the first cutting edge 5.

When the first cutting edge 5 includes the second grooves 13, it becomes easier to guide a chip flow direction in an extending direction of the plurality of second grooves 13. That is, it becomes easier to control the chip flow direction. The chips are therefore less likely to be caught, thus leading to enhanced chip discharge performance.

Particularly, when the plurality of second grooves 13 are orthogonal to the ridge line, it is possible to further enhance the chip discharge performance. The term "being orthogonal" denotes that the extending direction of the second grooves 13 and an extending direction of the ridge line need not strictly form 90°. In cases where the angle formed by the extending direction of the second grooves 13 and the extending direction of the ridge line falls within a range of approximately 80-100°, the plurality of second grooves 13 are regarded as being orthogonal to the ridge line.

For example, in non-limiting aspects of the disclosure illustrated in FIGS. 5 and 6, the ridge line along which the first cutting edge 5 is located extends in a left-right direction, whereas a plurality of second grooves 13 respectively extend vertically. Accordingly, the plurality of second grooves 13 are orthogonal to the ridge line.

When a length L1 of each of the second grooves 13 in a direction orthogonal to the ridge line is greater than a width W1 of each of the second grooves 13 in a direction along the ridge line in a front view of the first surface 8, the chip flow direction can be more easily controlled by the second grooves 13, thereby further enhancing chip discharge performance.

When a length L1 of each of the second grooves 13 in the direction orthogonal to the ridge line in the front view of the first surface 8 is greater than a length L2 of each of the second grooves 13 in the direction orthogonal to the ridge line in a front view of the second surface 9, the chip discharge performance can be further enhanced and surface roughness of a finish surface can be further improved. The reason for this is as follows. The chip flow direction can be more easily controlled because the length L1 of each of the second grooves 13 in the front view of the first surface 8 is relatively long, and each of the second grooves 13 is less likely to contact with the finish surface because the length L2 of each of the second grooves 13 in the front view of the second surface 9 is relatively short.

The configuration of the first cutting edge 5 located along the ridge line along which the first surface 8 intersects with the second surface 9 has been described above. The second cutting edge 4 may have a similar configuration to that of the first cutting edge 5. Specifically, when the second cutting edge 4 is located in at least a part of a ridge line which a third surface including a rake surface region intersects with a fourth surface including a flank surface region, the diamond layer 11 may be located in at least a part of the third surface, at least a part of the fourth surface, and at least a part of the second cutting edge 4. A maximum height Ry in a portion of the second cutting edge 4 at which the diamond layer 11 is located may be smaller than a maximum height Ry in a portion of the third surface at which the diamond layer 11 is located. The maximum height Ry in the portion of the second cutting edge 4 at which the diamond layer 11 is located may be greater than a maximum height Ry in a portion of the fourth surface at which the diamond layer 11 is located.

In cases where the third surface, the fourth surface, and the second cutting edge 4 have the above configurations, chatter vibration is much less likely to occur at the start of the cutting process, chip discharge performance can be further enhanced, and surface roughness of a finish surface becomes better and smoother.

As a material of the base member 10, it is possible to use hard materials, such as cemented carbide, cermet, silicon nitride, aluminum oxide, and cubic boron nitride. Particularly, when the material of the base member 10 is cemented carbide, the cutting tool 1 has excellent fracture resistance.

Adhesion between the base member 10 and the diamond layer 11 is high when an interface roughness in an interface between the base member 10 and the diamond layer 11 is 0.12-0.8 µm. The interface roughness is obtainable in the following manner. While observing an SEM photograph in a cross section including the interface between the base member 10 and the diamond layer 11, the interface is identified by tracing the interface between the base member 10 and the diamond layer 11 in the photograph. An arithmetic mean roughness Ra in the identified interface is calculated in accordance with JIS B0601' 2001. The arithmetic mean roughness Ra is evaluated as the interface roughness.

An outer peripheral surface including the second surface 9 in the cutting tool 1 may be smoothened by a polishing process, such as a brush process and a blast process.

When a thickness of the diamond layer 11 in the first cutting edge 5 which is located at a side of the first end P in the cutting tool 1, specifically, located in a range from the first end P of the cutting tool 1 to a position of 5 mm therefrom in a direction along the rotation axis O is greater than a thickness of the diamond layer 11 at a position of 10 mm from the first end P of the cutting tool 1 in a direction toward the second end Q, the diamond layer 11 is less likely to be worn away in the first cutting edge 5, and smoothness of the surface of the diamond layer 11 in the first surface 8 can be easily maintained. A ratio ($t_z/t_x$) of a film thickness $t_x$ of the diamond layer 11 in the first cutting edge 5 which is located in the range from the first end P to the position of 5 mm therefrom in the direction along the rotation axis O, and a film thickness $t_z$ of the diamond layer 11 located at the position of 10 mm from the first end P of the cutting tool 1 in the direction toward the second end Q may be in a range of 0.5-0.9 in a non-limiting aspect of the disclosure or may be 0.6-0.8 in another non-limiting aspect of the disclosure. A range of the film thickness $t_x$ may be 5-12 μm.

When a thickness of the diamond layer 11 in the first surface 8 is smaller than a thickness of the diamond layer 11 in the first cutting edge 5, excessive cutting resistance is less likely to be applied at the start of the cutting process.

When a ratio ($t_g/t_x$) of the film thickness $t_x$ of the diamond layer 11 in the first cutting edge 5 and a film thickness $t_g$ of the diamond layer 11 in the first surface 8 is 0.6-0.9, the diamond layer 11 is less likely to be worn away in the first cutting edge 5, and smoothness of the diamond layer 11 in the first surface 8 can be maintained.

A thickness of the diamond layer 11 in the first cutting edge 5 indicates a thickness of the diamond layer 11 in a direction along a bisector of the first surface 8 and the second surface 9 in the sectional view illustrated in FIG. 3. A thickness of the diamond layer 11 in the first surface 8 indicates a thickness of the diamond layer 11 in a portion of the first surface 8 which is closest to a deepest portion of the first groove 6.

The deepest portion of the first groove 6 indicates a position located at a shortest distance from the rotation axis O. A diameter "d" of a circle passing through the position located at the shortest distance around the rotation axis O, namely, a maximum inscribed circle "c" drawable within the cutting tool 1 in the sectional view as illustrated in FIG. 3 is a web thickness.

A cutting tool 101 of a non-limiting aspect of the disclosure is described below. The following description is mainly focused on differences in the cutting tool 101 from the cutting tool 1, and descriptions of configurations similar to those in the cutting tool 1 are omitted here.

Figure 8:
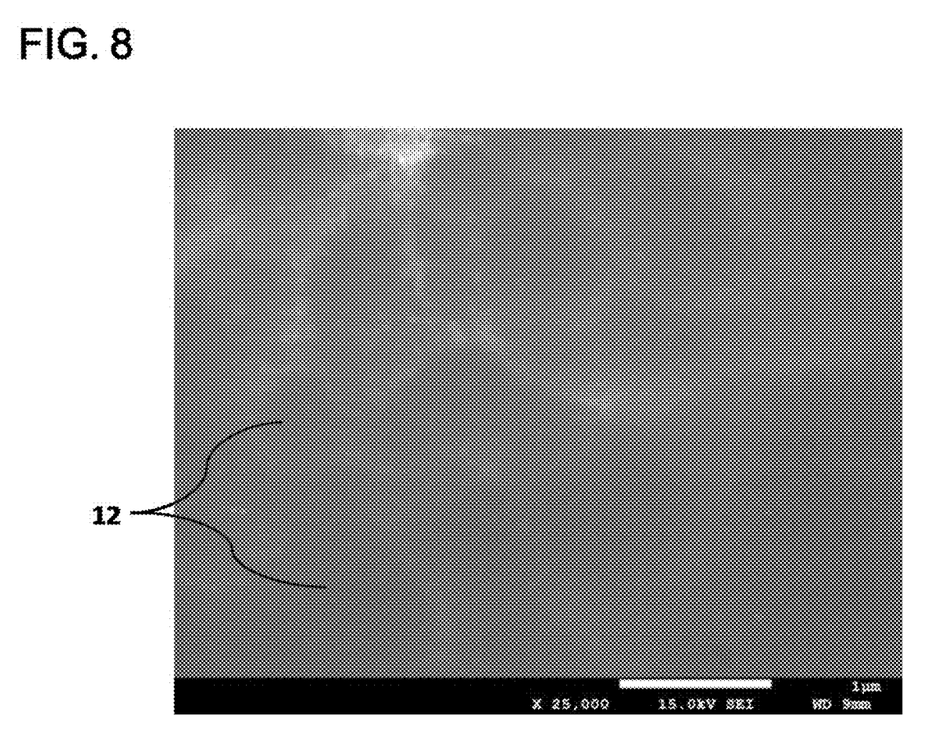
FIG. 8 is a perspective view illustrating a cutting tool in a non-limiting aspect of the disclosure.

As illustrated in FIG. 8, the present non-limiting aspect of the disclosure illustrates an indexable end mill as a cutting tool. The cutting tool 101 (end mill) of the present non-limiting aspect of the disclosure has a rotation axis O, and includes a bar-shaped holder 32 extending from a first end P to a second end Q, and a cutting insert (hereinafter referred to as "an insert") 34 located at a predetermined location on a side of the first end P in the holder. The non-limiting aspect of the disclosure illustrated in FIG. 8 includes, as the insert, a first insert 34a for an inner cutting edge and a second insert 34b for an outer cutting edge. The second insert 34b is located a location further away from the rotation axis than the first insert 34a.

The first insert 34a and the second insert 34b may differ in shape, or alternatively may have the same shape. The first insert 34a and the second insert 34b have the same shape in the non-limiting aspect of the disclosure illustrated in FIG. 8. Therefore, the first insert 34a and the second insert 34b are hereinafter collectively referred to as the insert 34.

Figure 9:
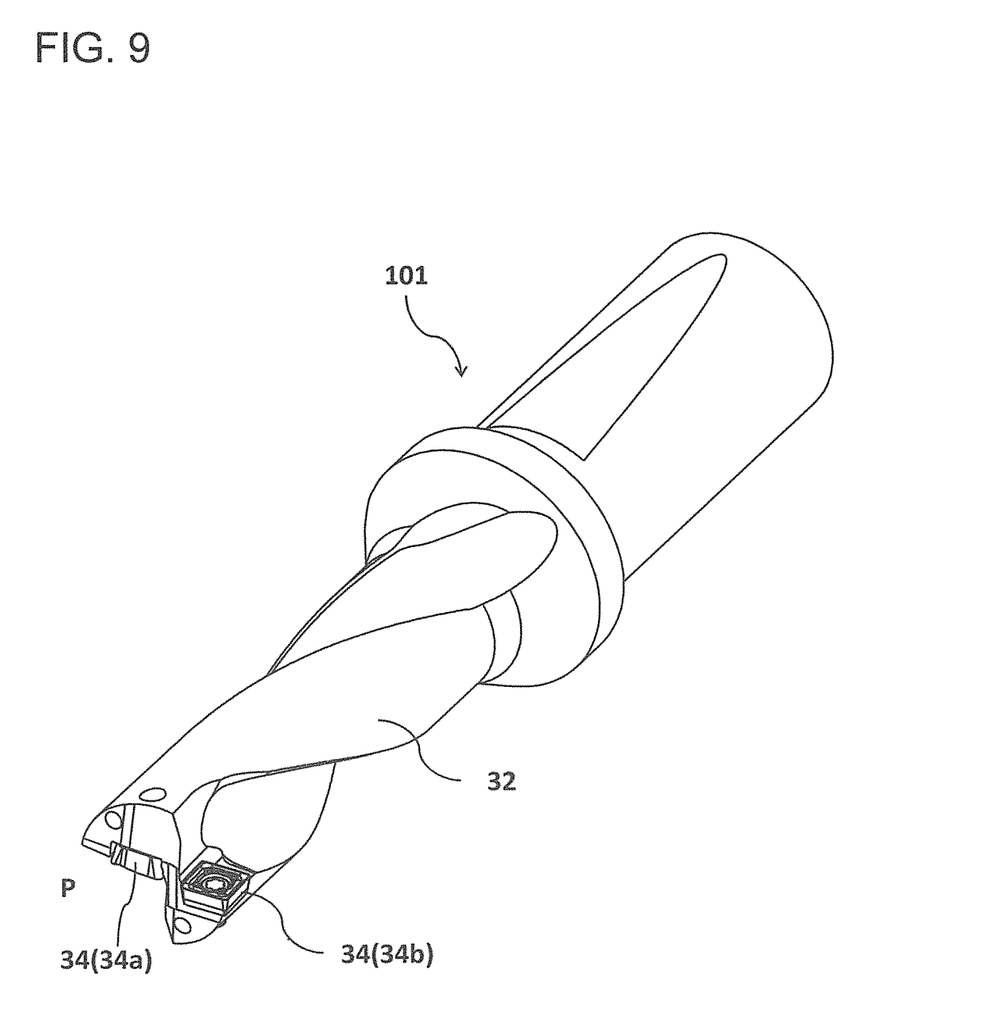
FIG. 9 is a perspective view of a cutting insert in the cutting tool of FIG. 8.

As illustrated in FIG. 9, the insert 34 includes a first surface 108 (an upper surface in FIG. 9) including a rake surface region, a second surface 109 (a side surface in FIG. 9) including a flank surface region, and a cutting edge 105 located in at least a part of a ridge line which the first surface 108 intersects with the second surface 109. The insert 34 includes a through hole 36 that opens at a middle part of the first surface 108. The through hole 36 is used, for example, when inserting a screw for fixing the insert 34 to the holder 32.

Figure 10:
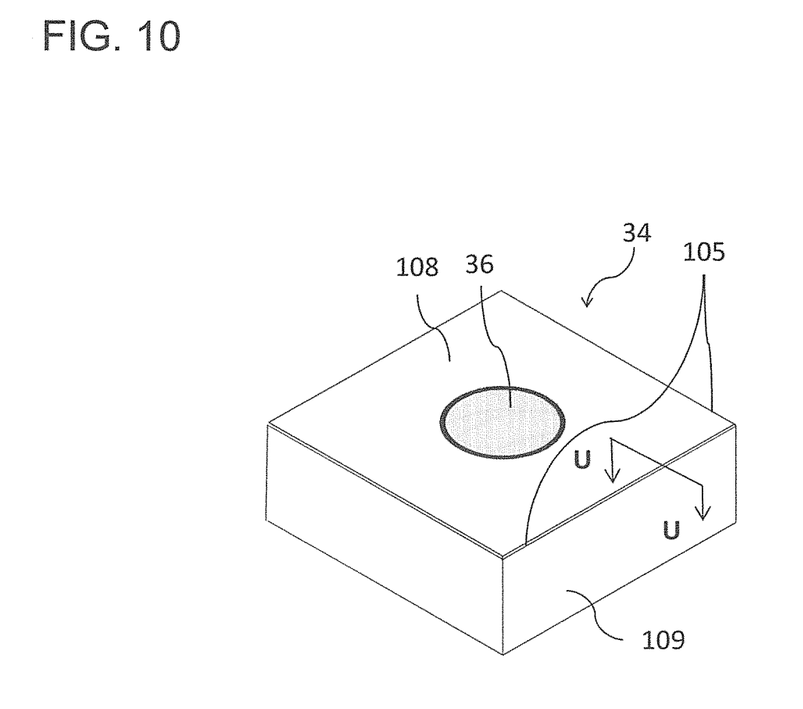
FIG. 10 is a sectional view taken along line U-U in FIG. 9.

As illustrated in FIG. 10 that is a sectional view taken along line U-U in FIG. 9, the insert 34 includes a base member 110 and a diamond layer 111 located on the base member 110. Here, the diamond layer 111 is located in at least a part of the first surface 108, at least a part of the second surface 109, and at least a part of the cutting edge 105.

In the insert 34 in the present non-limiting aspect of the disclosure, a maximum height Rye in a portion of the cutting edge 105 at which the diamond layer 111 is located is smaller than a maximum height Ryr in a portion of the first surface 108 at which the diamond layer 111 is located.

The maximum height Rye in the portion of the cutting edge 105 at which the diamond layer 111 is located is greater than a maximum height Ryf in a portion of the second surface 109 at which the diamond layer 111 is located. That is, a relationship of Ryf<Rye<Ryr is established as in the case of the cutting tool 1.

The cutting edge 105 is therefore less likely to come into a flat contact with a workpiece at the start of a cutting process. Consequently, cutting resistance is reducible and chatter vibration is less likely to occur in the cutting edge 105. Additionally, when chips come into contact with the first surface 108, the chips tend to deform or alter on the first surface 108, and the chips are less likely to extend excessively, thus leading to enhanced chip discharge performance. It is also possible to improve finish surface roughness of the workpiece.

(Manufacturing Method)

A method of manufacturing the above cutting tool 1 is described below. The following manufacturing method is a non-limiting aspect of the method of manufacturing the cutting tool 1. The cutting tool 1 is therefore not limited to one which is manufactured by the following manufacturing method.

Firstly, a centerless process is applied to a surface of a first member composed of a hard material, such as cemented carbide, cermet, silicon nitride, aluminum oxide, and cubic boron nitride. Thereafter, a columnar second member is manufactured by applying a sharpening process to the first member. If desired, a polishing process may be applied to a part of the second member which serves as a flank surface region. A base member 10 before depositing a diamond layer 11 thereon is obtainable by carrying out etching processes including acid treatment and alkali treatment in this order.

During the alkali treatment, a major crystal phase of the hard material exposed to a surface of the base member 10 can be roughened by pouring an alkaline solution containing an alkali aqueous solution and diamond abrasive grains into an ultrasonic washing container, and by applying ultrasound thereto. The etched base member 10 is washed with water and then dried. Here, a state of an SP3 ratio in the diamond layer 11 is adjustable depending on ultrasonic power applied during ultrasonic washing, control of particle diameter of the diamond abrasive grains, and alkali treatment time.

Subsequently, the diamond layer 11 is deposited on the surface of the base member 10. Hot filament CVD method is suitably applicable as a method of depositing the diamond layer 11. A non-limiting aspect of the deposition method is described with reference to FIG. 11. A deposition apparatus 50 illustrated in FIG. 11 includes a chamber 51. The chamber 51 includes therein a sample stand 53 designed to set samples (the etched base members 10) thereon. With the present non-limiting aspects of the disclosure, each of the bar-shaped base members 10 in an upright state, specifically, in a direction in which a cutting edge part 2 is located on an upper side and a shank part 3 is located on a lower side, is set to the sample stand 53. A first cutting edge 5 and a first groove 6, which constitute the cutting edge part 2, are omitted in FIG. 11.

Figure 11:
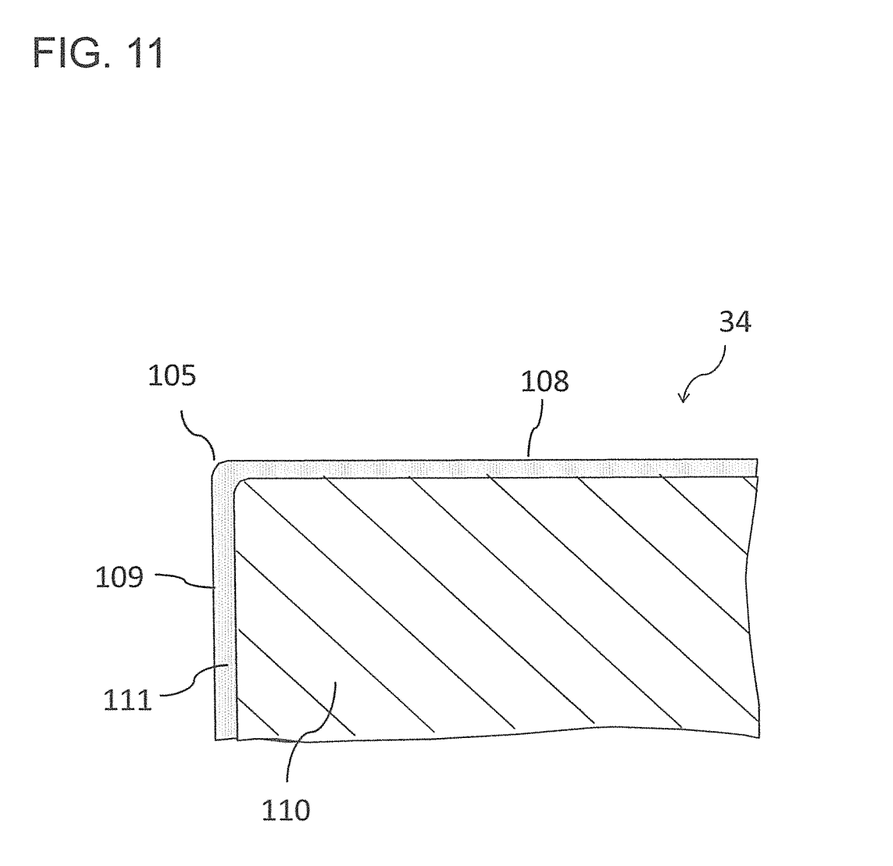
FIG. 11 is a schematic diagram for describing a deposition process for a diamond layer in the cutting tool of FIG. 1.

Heaters 54, such as filaments, are disposed around the base members 10. The heaters 54 are respectively connected to power sources 55 disposed outside the chamber 51. A temperature of each of the base members 10 set onto the sample stand 53 is controllable to 850-930° C. by adjusting arrangement positions of the heaters 54, and by adjusting a current value supplied to each of the heaters 54. The heaters 54 are respectively supported by a support body 58.

The chamber 51 includes a gas supply port 56 and a gas discharge port 57. The diamond layer 11 can be deposited by supplying hydrogen gas and methane gas from the gas supply port 56 into the evacuated chamber 51, and by spraying these gases to each of the base members 10.

Specific deposition conditions for the diamond layer 11 are described below. A mixing ratio of a mixed gas passed through during the deposition is controlled. Specifically, a mixing ratio (% by volume) of methane when depositing the diamond layer 11 is controlled so that the mixing ratio is high in an initial stage and then becomes low thereafter. This makes it possible to control the SP3 ratio in the diamond layer 11.

After depositing the diamond layer 11, gas bombardment treatment is carried out using the deposition apparatus 50 under conditions that a bias voltage is 200-600 V, more suitably 250-450 V, gas pressure is 2.5-4.5 Pa, and treatment time is 15-45 minutes. Thereby, a maximum height of the diamond layer 11 in each of a first surface 8, a second surface 9, and a first cutting edge 5 can be controlled in a predetermined range.

EXAMPLES

An amount of 10% by mass of metal cobalt (Co) powder, an amount of 0.2% by mass of titanium carbide (TiC) powder, an amount of 0.8% by mass of chromium carbide ($Cr_3C_2$) powder were added to tungsten carbide (WC) powder having a mean particle diameter of 0.5 μm. These were mixed together and molded into a columnar shape, followed by sintering. This was then subjected to a centerless process and a sharpening process, thereby forming a first member having an end mill shape. Acid treatment and alkali treatment were applied to the first member. Thereafter, a base member (6 mm in diameter, 10 mm in cutting edge length, 3 mm in web thickness, two-flute) was manufactured by washing, with distilled water, a surface of a second member as a precursor of a base member. During the alkali treatment, an alkali aqueous solution with diamond abrasive grains having a mean particle diameter of 5 μm was prepared in a container for an ultrasonic washing machine, and the second member was immersed therein and treated under conditions of ultrasonic washing by using power and time presented in Table 1. Interface roughness of the base member was controlled by changing centerless process conditions and oxygen treatment conditions.

Subsequently, the base member was set to the deposition apparatus illustrated in FIG. 11, and a diamond layer was deposited on a surface of the base member by hot filament CVD method. The deposition apparatus was provided with a reaction chamber having a diameter of 25 cm φ and a height of 20 cm. The reaction chamber included therein a total of four tungsten filaments having a thickness of 0.4 mm φ. Two of the four tungsten filaments were disposed in a longitudinal direction of the base member, and the remaining two tungsten filaments were disposed on a side surface so as to hold the base member therebetween. The base member was set in an upright state in which a cutting edge part was located on an upper side and a shank part was located on a lower side.

A diamond layer was deposited on the base member in vacuum by heating to 920° C. under conditions that a deposition temperature was 920° C. for five minutes in an earlier stage and a deposition temperature was 900° C. in a later stage. After depositing the diamond layer, a maximum height of each of the first cutting edge, the first surface, and the second surface prior to gas bombardment treatment described later was measured by employing, as a measuring point, a middle position of a length in the longitudinal direction which corresponded to a cutting edge part.

A solid-type end mill was obtained by carrying out the gas bombardment treatment within the deposition apparatus under conditions presented in Table 1, after depositing the diamond layer.

Maximum heights Rye, Ryr, and Ryf, and arithmetic mean roughnesses Rae, Rar, and Raf of the first cutting edge, the first surface, and the second surface in the obtained end mill were respectively measured by employing, as a measuring point, the middle position of the length in the longitudinal direction which corresponds to the cutting edge part. Measurements were carried out by Raman scattering spectroscopy at an interface position between the diamond layer and the base member and an intermediate position in the first cutting edge, the first surface, and the second surface at the position described above, and SP3 ratios ($S_{1e}$, $S_{1r}$, $S_{1f}$, $S_{2e}$, $S_{2r}$, and $S_{2f}$) were estimated.

SEM observations of surfaces of the first cutting edge, the first surface, and the second surface were carried out to check whether contours of diamond crystals were observable. When the contours of the diamond crystals were observable, a mean particle diameter of the diamond crystals was measured. When measuring the mean particle diameter, the measurements were carried out in a field of view where 10 or more diamond crystals were observable, the result was 0.8 μm. Further, thicknesses of the diamond layer were measured by carrying out SEM observations of cross sections of the diamond layer at a position of 2 mm behind the first end of the end mill in a direction along the rotation axis, and at a position of 10 mm behind the first end. The results were presented in Tables 1 and 2.

Cutting performance was evaluated by conducting a cutting test using the obtained end mills under the following cutting conditions.
Cutting method: boring (through hole)
Workpiece: CFRP
Cutting speed (feed): 100 mm/min
Feed rate: 0.075 mm/tooth Depth of cut: 8 mm in depth, ϕ6 mm in bore diameter
Cutting state: wet (using a cutting fluid)
Evaluation method: The presence or absence of chatter vibration in the initial stage of machining was checked. The absence of chatter vibration was indicated by symbol "O", occurrence of slight chatter vibration was indicated by symbol "Δ", and occurrence of greater chatter vibration than that indicated by symbol "Δ" was indicated by symbol "▲". Tendency of entanglement of chips during machining was evaluated as chip discharge performance. Finish surface roughness of the workpiece after machining a length of cut of 20 m was measured. A length of cut until becoming nonmachinable was evaluated. The results were presented in Table 3.

TABLE 1

| | Maximum height before bombardment treatment (μm) | | | Bombardment condition | | | Maximum height Ry (μm) | | | Arithmetic mean roughness Ra (μm) | | |
|---|---|---|---|---|---|---|---|---|---|---|---|---|
| Sample No. | First cutting edge | First surface | Second surface | Bias voltage (V) | Gas pressure (Pa) | Time (minutes) | $R_{ye}$ | $R_{yr}$ | $R_{yf}$ | $R_{ae}$ | $R_{ar}$ | $R_{af}$ |
| 1 | 2.61 | 2.16 | 1.56 | 400 | 4.2 | 20 | 0.35 | 0.95 | 0.14 | 0.081 | 0.105 | 0.041 |
| 2 | 2.69 | 1.67 | 1.65 | 250 | 3.5 | 40 | 0.51 | 0.94 | 0.31 | 0.068 | 0.122 | 0.051 |
| 3 | 2.96 | 2.15 | 1.67 | 450 | 4.5 | 25 | 0.41 | 0.88 | 0.21 | 0.096 | 0.156 | 0.049 |
| 4 | 3.1 | 1.61 | 1.61 | 600 | 2.5 | 15 | 0.34 | 1.11 | 0.12 | 0.067 | 0.225 | 0.051 |
| 5 | 2.56 | 1.69 | 1.84 | 200 | 3.5 | 45 | 0.49 | 1.31 | 0.31 | 0.084 | 0.212 | 0.071 |
| 6 | 2.36 | 1.86 | 1.56 | 400 | 2.5 | 40 | 0.54 | 0.85 | 0.2 | 0.061 | 0.195 | 0.056 |
| 7 | 3.25 | 2.51 | 1.77 | 350 | 3.4 | 40 | 0.4 | 0.95 | 0.21 | 0.067 | 0.126 | 0.065 |
| 8 | 3.15 | 2.21 | 1.75 | 550 | 4 | 30 | 0.6 | 1.21 | 0.11 | 0.075 | 0.216 | 0.042 |
| 9 | 2.5 | 2.05 | 1.91 | 800 | 4.2 | 50 | 0.55 | 0.5 | 0.41 | 0.055 | 0.035 | 0.5 |
| 10 | 2.51 | 1.57 | 1.54 | 800 | 4.2 | 5 | 0.4 | 1.25 | 1.04 | 0.066 | 0.259 | 0.254 |
| 11 | 1.39 | 2.02 | 1.59 | | | — | 1.39 | 2.02 | 1.59 | 0.25 | 0.768 | 0.533 |

TABLE 2

| | SP3 ratio of interface side | | | SP3 ratio of intermediate position | | | Presence or Absence of contour | | | Thickness (μm) | | |
|---|---|---|---|---|---|---|---|---|---|---|---|---|
| Sample No. | $S_{1e}$ | $S_{1r}$ | $S_{1f}$ | $S_{2e}$ | $S_{2r}$ | $S_{2f}$ | Peripheral cutting edge | Outer peripheral rake surface | Outer peripheral flank surface | $t_X$ | $t_Z$ | $t_Z/t_X$ |
| 1 | 1.3 | 1.1 | 1.1 | 1.2 | 1 | 1 | Present | Absent | Absent | 12.1 | 9.1 | 0.75 |
| 2 | 1.4 | 1.2 | 1.1 | 1.3 | 1.1 | 1 | Present | Absent | Absent | 10 | 8.5 | 0.85 |
| 3 | 1.3 | 1 | 1.1 | 1.2 | 0.9 | 1 | Present | Absent | Absent | 9.7 | 6.1 | 0.63 |
| 4 | 1.2 | 1 | 1.1 | 1.1 | 0.9 | 1 | Present | Absent | Absent | 9.2 | 7.8 | 0.85 |
| 5 | 1.2 | 0.9 | 1.1 | 1.1 | 0.8 | 1 | Present | Absent | Absent | 8.5 | 7.5 | 0.88 |
| 6 | 1.2 | 1.1 | 1 | 1.2 | 1.1 | 1 | Present | Absent | Absent | 14.1 | 8 | 0.57 |
| 7 | 1.2 | 1 | 1 | 1.2 | 1 | 1 | Present | Absent | Absent | 11 | 10.7 | 0.97 |
| 8 | 1 | 0.7 | 1 | 1 | 0.7 | 1 | Some | Absent | Absent | 7.9 | 7.9 | 1 |
| 9 | 0.8 | 0.6 | 0.8 | 0.8 | 0.6 | 0.8 | Present | Absent | Absent | 8.3 | 8.3 | 1 |
| 10 | 0.8 | 0.6 | 0.8 | 0.8 | 0.6 | 0.8 | Present | Absent | Absent | 8.5 | 8.5 | 1 |
| 11 | 0.9 | 0.6 | 0.9 | 0.9 | 0.6 | 0.9 | Absent | Absent | Absent | 9.1 | 9.1 | 1 |

TABLE 3

| | Cutting performace | | | |
|---|---|---|---|---|
| Sample No. | Chatter vibration | Chip discharge performance | Finish surface roughness (μm) | Length of cut (m) |
| 1 | O | O | 1.2 | 52 |
| 2 | O | O | 1.4 | 50 |
| 3 | O | O | 1.5 | 49 |
| 4 | O | O | 1.8 | 46 |
| 5 | O | O | 2 | 45 |
| 6 | O | O | 2.1 | 44 |
| 7 | O | O | 2.3 | 42 |
| 8 | Δ | O | 2.5 | 40 |
| 9 | ▲ | ▲ | 3 | 35 |
| 10 | Δ | O | 5 | 28 |
| 11 | ▲ | ▲ | 5 | 30 |

Tables 1 to 3 show the following. In Samples Nos. 1-8 in which Rye is smaller than Ryr and Rye is greater than Ryf, no chatter vibration or less chatter vibration occurred in the initial stage of machining, chip discharge performance is good, finish surface roughness is small and smooth, and the length of cut becomes longer.

DESCRIPTION OF THE REFERENCE NUMERALS

1, 101 cutting tool
2 cutting edge part
3 shank part
4 second cutting edge
5 first cutting edge
6 first groove
7 gash 8, 108 first surface
9, 109 second surface
10, 110 base member
11, 111 diamond layer
13 second groove

What is claimed is:

1. A cutting tool, comprising:
a base member;
a diamond layer located on the base member; and
a first surface, a second surface, and a cutting edge located in at least a part of a ridge line at which the first surface intersects with the second surface, wherein
the diamond layer is located in at least a part of the first surface, at least a part of the second surface, and at least a part of the cutting edge;
in terms of surface roughness of the diamond layer, a first maximum height in the cutting edge is smaller than a second maximum height in the first surface, and the first maximum height in the cutting edge is greater than a third maximum height in the second surface;
a mean particle diameter of the diamond crystals has a value in a range of 0.8 μm-3.0 μm and is observable at magnifications of 10,000-30,000;
the cutting edge has a convex curved surface shape in a cross section orthogonal to the ridge line, and the cutting edge comprises a plurality of grooves that extend across an entirety of the cutting edge in a direction intersecting with the ridge line; and
the maximum height is 0.3-0.7 μm and an arithmetic mean roughness is 0.06-0.1 μm in the cutting edge,
the maximum height is 0.8-1.4 μm and an arithmetic mean roughness is 0.1-0.25 μm in the first surface, and
the maximum height is 0.1-0.5 μm and an arithmetic mean roughness is 0.04-0.08 μm in the second surface.

2. The cutting tool according to claim 1, wherein
an SP3 ratio in the cutting edge is greater than an SP3 ratio in each of the first surface and the second surface, where an SP3 ratio is a ratio (SP3/SP2) obtainable from an SP3 peak derived from diamond crystals measurable by Raman spectrum analysis, and an SP2 peak derived from a graphite phase.

3. The cutting tool according to claim 1, wherein
the plurality of grooves are orthogonal to the ridge line.

4. The cutting tool according to claim 1, wherein
a length of each of the grooves in a direction orthogonal to the ridge line is greater than a width of each of the grooves in a direction along the ridge line in a front view of the first surface.

5. The cutting tool according to claim 1, wherein
a length of each of the grooves in a direction orthogonal to the ridge line extends onto both the first surface and the second surface, and in a front view of the first surface a length of each of the grooves in the direction orthogonal to the ridge line is greater than a length of each of the grooves in the direction orthogonal to the ridge line in a front view of the second surface.

6. The cutting tool according to claim 1, wherein
a thickness of the diamond layer in the first surface is less than a thickness of the diamond layer in the cutting edge.

7. The cutting tool according to claim 1, wherein
a thickness of the diamond layer in the first surface is less than a thickness of the diamond layer in the second surface.

8. The cutting tool according to claim 1, wherein
a length of each of the grooves extends onto both the first surface and the second surface.

9. The cutting tool according to claim 1, wherein
an arithmetic mean roughness at an interface between the base member and the diamond layer is in a range of 0.12 μm-0.8 μm.

10. The cutting tool according to claim 1, wherein
a ratio of a thickness of the diamond layer located from the ridge line at a front end of the cutting tool to 5 mm away therefrom in a direction parallel to a rotation axis of the cutting tool to a thickness of the diamond layer at a point in the first surface that is greater than 10 mm away from the ridge line at the front end of the cutting tool in the direction parallel to the rotation axis of the cutting tool is in a range of 0.5-0.9.

11. The cutting tool according to claim 6, wherein
a ratio of the thickness of the diamond layer in the first surface to the thickness of the diamond layer in the cutting edge is in a range of 0.6-0.9.

* * * * *

UNITED STATES PATENT AND TRADEMARK OFFICE
CERTIFICATE OF CORRECTION

PATENT NO. : 11,642,730 B2
APPLICATION NO. : 16/096310
DATED : May 9, 2023
INVENTOR(S) : Masahiro Waki It is certified that error appears in the above-identified patent and that said Letters Patent is hereby corrected as shown below:

In the Drawings

Please replace Drawing Sheet 8 of 11 with attached Replacement Drawing Sheet 8 of 11, which contains originally filed Fig. 9 now renumbered as Fig. 8.

Please replace Drawing Sheet 9 of 11 with attached Replacement Drawing Sheet 9 of 11, which contains originally filed Fig. 10 now renumbered as Fig. 9.

Please replace Drawing Sheet 10 of 11 with attached Replacement Drawing Sheet 10 of 11, which contains originally filed Fig. 11 now renumbered as Fig. 10.

Please replace Drawing Sheet 11 of 11 with attached Replacement Drawing Sheet 11 of 11, which contains originally filed Fig. 12 now renumbered as Fig. 11.

Signed and Sealed this
Eighth Day of October, 2024

Katherine Kelly Vidal
*Director of the United States Patent and Trademark Office*